United States Patent
Fu et al.

(10) Patent No.: US 12,220,843 B2
(45) Date of Patent: *Feb. 11, 2025

(54) SYSTEM FOR PHYSICALLY DISMANTLING SOLAR CELL MODULE

(71) Applicant: TSGC Technologies Inc., Tainan (TW)

(72) Inventors: Yao-Hsien Fu, Kaohsiung (TW); Chia-Tsung Hung, Tainan (TW)

(73) Assignee: TSGC TECHNOLOGIES INC., Tainan (TW)

( * ) Notice: Subject to any disclaimer, the term of this patent is extended or adjusted under 35 U.S.C. 154(b) by 243 days.

This patent is subject to a terminal disclaimer.

(21) Appl. No.: 17/860,034

(22) Filed: Jul. 7, 2022

(65) Prior Publication Data

US 2024/0009893 A1    Jan. 11, 2024

(51) Int. Cl.
  *B29B 17/02*    (2006.01)
  *H01L 31/048*   (2014.01)
  *H01L 31/18*    (2006.01)

(52) U.S. Cl.
  CPC ............ *B29B 17/02* (2013.01); *H01L 31/048* (2013.01); *H01L 31/1804* (2013.01); *B29B 2017/0224* (2013.01); *B29B 2017/0231* (2013.01)

(58) Field of Classification Search
  CPC ............ B29B 17/02; B29B 2017/0224; B29B 2017/0231; B29B 17/04; B29B 2017/0484; H01L 31/048; H01L 31/1804; B29L 2009/00; B29L 2031/34
  See application file for complete search history.

(56) References Cited

U.S. PATENT DOCUMENTS

2023/0339001 A1* 10/2023 Miyako .................. B24C 1/086

* cited by examiner

*Primary Examiner* — Jacob S. Scott
*Assistant Examiner* — Miraj T. Patel
(74) *Attorney, Agent, or Firm* — MUNCY, GEISSLER, OLDS & LOWE, P.C.

(57) ABSTRACT

A system for physically dismantling a solar cell module includes two fragmenting apparatuses. The solar cell module includes a cell encapsulation laminate, and a back plate and a cover plate respectively disposed on two opposite sides of the cell encapsulation laminate. Each fragmenting apparatus includes a platform, a fragmenting unit disposed on and movable relative to the platform in three axial directions for fragmenting one of the cell encapsulation laminate and the back plate of the solar cell module, and a material-collecting and sorting device connected to the platform and the fragmenting unit for collecting and sorting recycled materials produced by the fragmenting unit.

11 Claims, 4 Drawing Sheets

SYSTEM FOR PHYSICALLY DISMANTLING SOLAR CELL MODULE

FIELD

The disclosure relates to a system for physically dismantling a solar cell module.

BACKGROUND

An existing solar cell module after being dismantled from an outer frame mainly includes a solar cell, a cover plate and a back plate disposed on two opposite sides of the solar cell, and adhesive layers respectively between the solar cell and the cover plate and between the solar cell and the back plate.

During a dismantling process of the existing solar cell module, generally, the whole solar cell module is directly fragmented, after which the fragmented solar cell module is thermally decomposed to allow chemical changes in the adhesive layers, so that the cover plate, the solar cell and the back plate can be separated from each other. However, the cover plate and the solar cell obtained by the thermal decomposition have been contaminated, and because the material used for the back plate is polyvinylidene difluoride (PVDF) or polyvinyl fluoride (PVF), it will produce volatile organic gases (VOCs), hydrofluorocarbons (HFCs) and other substances harmful to the environment during the thermal decomposition process.

Thus, it can be seen that the existing process of separating the solar cell module and the adhesive layers through the thermal decomposition will not only pollute the environment, but also will require high energy consumption which is not economical. Furthermore, the separated cover plate and solar cell have been contaminated, resulting in low economic benefits of the subsequent recycling.

SUMMARY

Therefore, an object of the present disclosure is to provide a system for physically dismantling a solar cell module that can alleviate at least one of the drawbacks of the prior art.

According to the present disclosure, a system is configured for physically dismantling a solar cell module that includes a cell encapsulation laminate, and a back plate and a cover plate respectively disposed on two opposite sides of the cell encapsulation laminate. The system includes two fragmenting apparatuses. Each of the fragmenting apparatuses includes a platform, a fragmenting unit, and a material-collecting and sorting device. The fragmenting unit is disposed on the platform and is movable relative to the platform in three axial directions for fragmenting one of the cell encapsulation laminate and the back plate of the solar cell module. The material-collecting and sorting device is connected to the platform and the fragmenting unit for collecting and sorting recycled materials produced by the fragmenting unit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
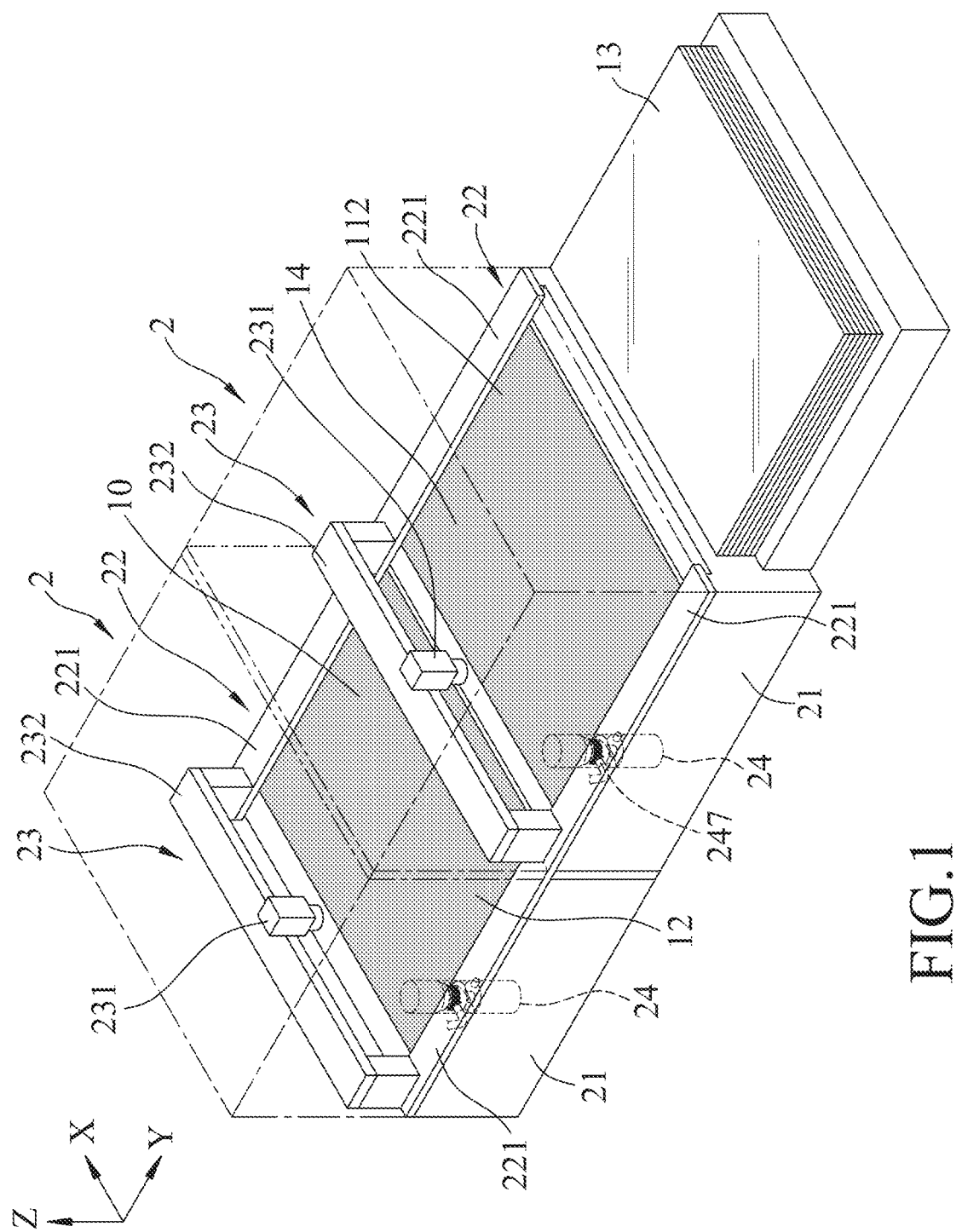
FIG. 1 is a perspective view of a system for physically dismantling a solar cell module according an embodiment of the disclosure.
Figure 2:
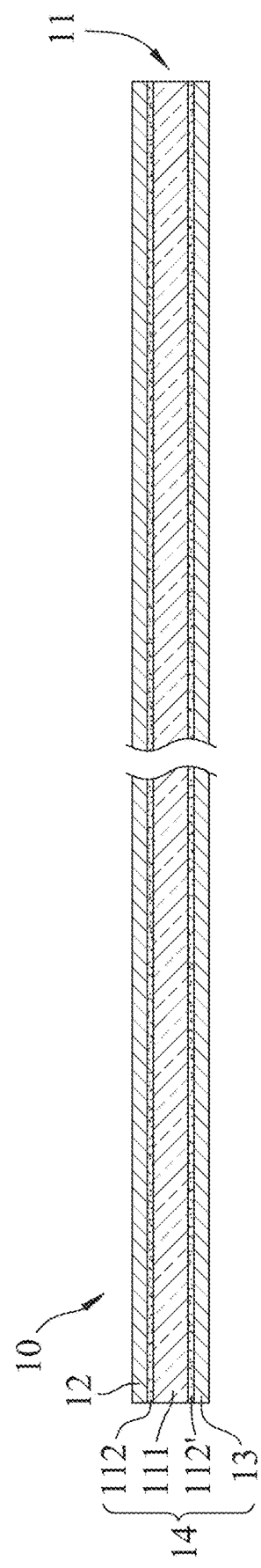
FIG. 2 is a fragmentary sectional view of the solar cell module.
Figure 3:
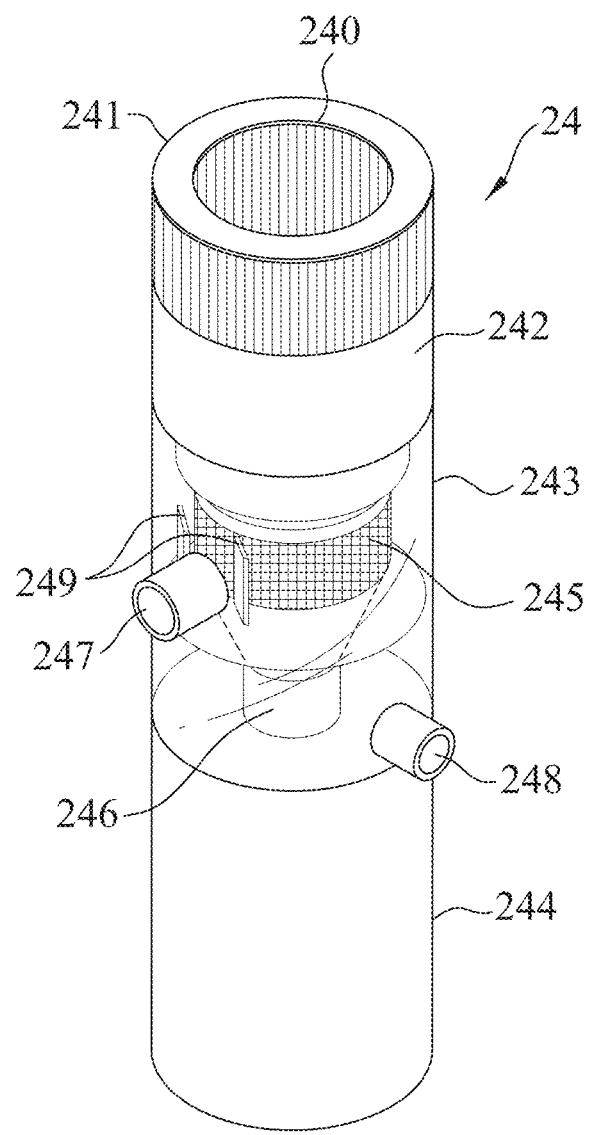
FIG. 3 is a perspective view of a material-collecting and sorting device of the embodiment.

Referring to FIGS. 1 to 3, a system for physically dismantling a solar cell module 10 according to an embodiment of the present disclosure includes two fragmenting apparatuses 2.

The solar cell module 10 includes a cell encapsulation laminate 11, and a back plate 12 and a cover plate 13 respectively disposed on two opposite sides of the cell encapsulation laminate 11. The cell encapsulation laminate 11 is composed of a solar cell panel 111 and two adhesive layers 112 and 112' respectively disposed on two opposite first and second sides of the solar cell panel 111, so that the back and cover plates 12, 13 are respectively connected to the first and second sides of the solar cell panel 111 through the adhesive layers 112 and 112'.

The two fragmenting apparatuses 2 are disposed one after the other along an operation line. The fragmenting apparatuses 2 use purely physical fragmenting methods for fragmenting the solar cell module 10. An upstream one of the fragmenting apparatuses 2 is used to fragment and remove the back plate 12 of the solar cell module 10 to leave a yet-to-be fragmented product 14 composed of the cell encapsulation laminate 11 and the cover plate 13, whereas a downstream one of the fragmenting apparatuses 2 is used to fragment the cell encapsulation laminate 11 to leave the cover plate 13 in one piece. Specifically, each fragmenting apparatus 2 includes a platform 21, a flattening unit 22, a fragmenting unit 23, and a material-collecting and sorting device 24. The platform 21 of the upstream fragmenting apparatus 2 is configured to support the solar cell module 10, while the platform 21 of the downstream fragmenting apparatus 2 is configured to support the yet-to-be fragmented product 14 that is fed from the platform 21 of the upstream fragmenting apparatus 2 after the back plate 12 is fragmented.

The flattening unit 22 is disposed on the platform 21, and includes two fixing members 221. The fixing members 221 of the flattening unit 22 of the upstream fragmenting apparatus 2 is configured to fix the solar cell module 10 to the platform 21, while the fixing members 221 of the flattening unit 22 of the downstream fragmenting apparatus 2 is configured to fix the yet-to-be fragmented product 14 to the platform 21 thereof. In this embodiment, each fixing member 221 is a press plate disposed on a lateral side of the platform 21. The solar cell module 10 or the yet-to-be fragmented product 14 is fixed to the platform 21 through the press plates or fixing members 221, and is prevented from warping. Noteworthily, the number and the configuration of the fixing members 221 are not particularly limited, as long as the solar cell module 10 or the yet-to-be fragmented product 14 can be stably and flatly fixed to the platform 21, any number and any configuration of the fixing members 221 are acceptable. Preferably, in order to make the solar cell module 10 or the yet-to-be fragmented product 14 more flatly fixed to the platform 21, the flattening unit 22 can further include a suction assembly (not shown) disposed on the platform 21 for suctioning the solar cell module 10 or the yet-to-be fragmented product 14. The suction assembly, as an example, includes a plurality of suction holes extending through the platform 21, and an air suction member connected to the suction holes. When the air suction member is operated to suck air through the suction holes, the solar cell module 10 or the yet-to-be fragmented product 14 can be stably adsorbed on the platform 21.

The fragmenting unit 23 is disposed on the platform 21 and is movable relative to the platform 21 in three axial directions. The fragmenting unit 23 of the upstream fragmenting apparatus 2 is used for fragmenting the back plate 12 of the solar cell module 10, while the fragmenting unit 23 of the downstream fragmenting apparatus 2 is used for fragmenting the cell encapsulation laminate 11, thereby producing recycled materials. In detail, the fragmenting unit 23 of each fragmenting apparatus 2 includes a fragmenting member 231 for fragmenting the back plate 12 or the cell encapsulation laminate 11, and a drive unit 232 connected to the fragmenting member 231. The drive unit 232 is actuatable to drive the fragmenting member 231 to move in the three axial directions for fragmenting the back plate 12 or the cell encapsulation laminate 11.

It should be noted that the number of the fragmenting member 231 is not particularly limited, and may be more than two. The number of the fragmenting member 231 may be changed according to the situation and application. There is no particular restriction on the selection of the fragmenting member 231 suitable for this disclosure, as long as the fragmenting member 231 can fragment the back plate 12 or the cell encapsulation laminate 11 by shaving, milling, scraping, cutting, or planing, any type of the fragmenting member 231 is acceptable. In this embodiment, the fragmenting member 231 is exemplified as having a CNC spindle to perform shaving, i.e., to connect and drive a tool (not shown) for shaving, milling, scraping, cutting, or planing. The drive unit 232 is connected to the fragmenting member 231 so as to drive the same to move in the three axial directions (X-Y-Z axial directions).

The structure of the drive unit 232 is known. For the sake of simplicity, only part of the drive unit 232 is shown in FIG. 1. The configuration of the drive unit 232 is not particularly limited as long as it can drive the fragmenting member 231 in three axial directions. In this embodiment, the drive unit 232 is composed of two horizontal transmission mechanisms (only shown partially) and a vertical transmission mechanism (not shown), and a drive motor (not shown) connected to the horizontal and vertical transmission mechanisms. An example of the drive unit 232 may be one disclosed in PCT international application number PCT/IB2021/059962, which is incorporated herein by reference.

Figure 4:
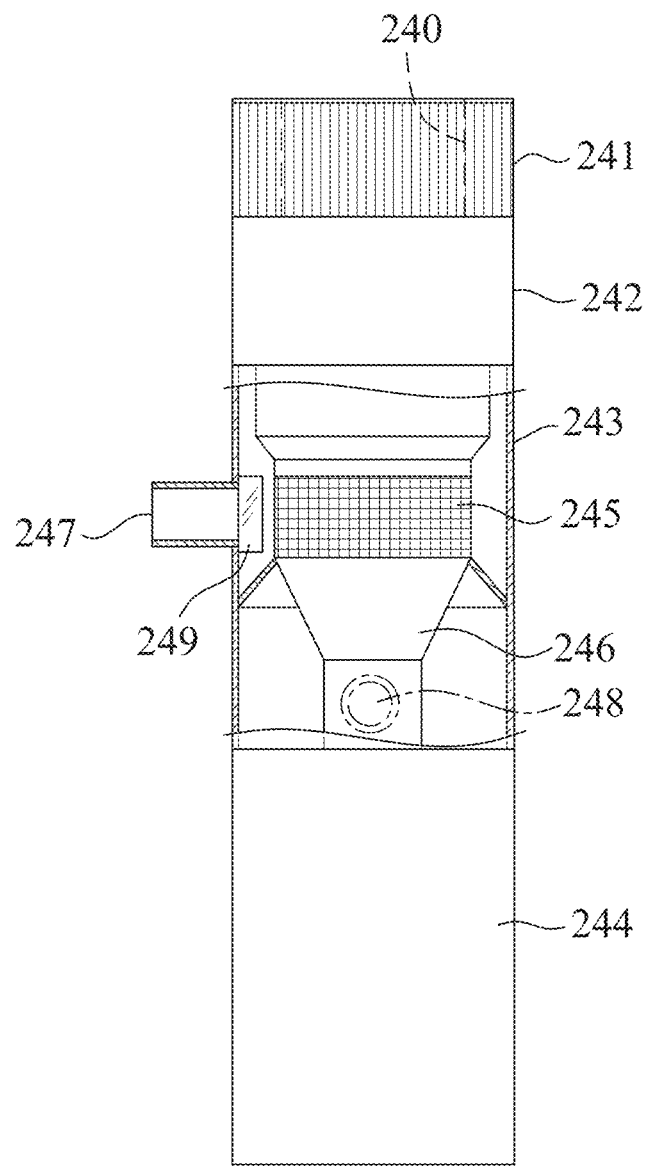
FIG. 4 is a partly sectional view of the material-collecting and sorting device of the embodiment.

Referring to FIG. 4, in combination with FIGS. 1 and 3, the material-collecting and sorting device 24 is connected to the platform 21 and the fragmenting unit 23 for collecting and sorting the recycled materials produced by the fragmenting unit 23. The material-collecting and sorting device 24 includes an air filter 241 having an exhaust opening 240, a blower 242 connected to the air filter 241 and can generate forced airflow, a sorting unit 243 connected to the blower 242, and a material-collecting container 244 removably connected to the sorting unit 243. The sorting unit 243 includes a material inlet 247 connected to the fragmenting member 231 for entry of the recycled materials, a screen 245 for sorting the recycled materials according to fragment size, a cyclone separator 246, and a material outlet 248. The cyclone separator 246 is connected to the screen 245, is capable of separating solid from gas, and is capable of collecting solar cell powder.

In detail, since the blower 242 of the material-collecting and sorting device 24 can produce a forced airflow path, and through this airflow, the recycled materials can be guided into the material-collecting and sorting device 24 through the material inlet 247, after which the recycled materials pass through the screen 245 and the cyclone separator 246, and then are discharged from the material outlet 248. Simultaneously, clean air is discharged through the exhaust opening 240. Preferably, one or more flow-guiding plates 249 can be disposed in an interior of the sorting unit 243 at a position corresponding to the material inlet 247, so that when the recycled materials enter the material inlet 247 and pass through the flow-guiding plates 249, the recycled materials are separated by the screen 245 and a vortex effect into small fragments of the recycled materials and large fragments of the recycled materials. By virtue of the cyclone separator 246 separating solid from gas, the small fragments of the recycled materials enter the cyclone separator 246 through the airflow path, and are collected in the material-collecting container 244. On the other hand, the large fragments of the recycled materials are limited by the size of the screen 245, and as the flow rate decreases, they sunk and are accumulated at the bottom of the sorting unit 243 and are then discharged from the material outlet 248.

To dismantle the solar cell module 10 using the system of this disclosure, the solar cell module 10 is first placed on the platform 21 of one of the fragmenting apparatuses 2 and is stably and flatly fixed thereon by the flattening unit 22 of the one of the fragmenting apparatuses 2. Because the back plate 12 is to be fragmented first, the solar cell module 10 is placed on the platform 21 such that the back plate 12 faces away from the platform 21 and is located between the platform 21 and the fragmenting member 231 of the one of the fragmenting apparatuses 2, so that the fragmenting member 231 can contact the back plate 12.

Subsequently, the drive unit 232 of the upstream fragmenting apparatus 2 is actuated to drive the fragmenting member 231 to move in the three axial directions and to fragment the back plate 12 by the physical method of shaving. Because the fragmenting member 231 of this embodiment is exemplified as having a CNC spindle, in coordination with the drive unit 232, the fragmenting member 231 can move in a three-dimensional space with an accuracy that can reach a micron ($\mu$m) level. The recycled materials produced from the fragmented back plate 12 are directly sucked into the material-collecting and sorting device 24 to be collected and sorted.

It should be noted that, because the back plate 12 is disposed on top of the adhesive layer 112 of the cell encapsulation laminate 11, the fragmenting member 231 will also contact the adhesive layer 112 when shaving the back plate 12. Since the back plate 12 is mainly made of a material, such as polyvinylidene difluoride (PVDF), and each adhesive layer 112, 112' is made of a material, such as ethylene vinyl acetate (EVA), there is a difference in the degree of hardness between the two. As such, in this embodiment, the fragmenting member 231 can further have a sensor (not shown) for detecting a resistance data. When the fragmenting member 231 contacts the adhesive layer 112 during shaving of the back plate 12, a change in resistance will be detected by the sensor. In this way, the fragmenting member 231 will not shave the cell encapsulation laminate 11 when shaving the back plate 12.

After the back plate 12 is fragmented by the fragmenting unit 23 of the upstream fragmenting apparatus 2, it leaves the yet-to-be fragmented product 14 composed of the cell encapsulation laminate 11 and the cover plate 13. The yet-to-be fragmented product 14 is then manually or mechanically moved to the platform 21 of the downstream fragmenting apparatus 2 for fragmenting the cell encapsulation laminate 11. When the drive unit 232 of the downstream fragmenting apparatus 2 is actuated to drive the fragmenting member 231 thereof to move in the three axial directions, the fragmenting member 231 will contact and fragment the cell encapsulation laminate 11 by shaving until it abut against the cover plate 13 without damaging the same, so that the cover plate 13 is left in one piece for reuse or recycle.

Since the cell encapsulation laminate 11 is composed of the solar cell panel 111 and the adhesive layers 112 and 112', solar cell fragments and adhesive layer fragments are produced after the cell encapsulation laminate 11 is fragmented. Due to the difference in Young's modulus, there is a great difference between the fragment size of the solar cell fragments and the fragment size of the adhesive layer fragments, which are measured in micron (μm) range and in millimeter (mm) range, respectively. Thus, the recycled materials generated by fragmenting the cell encapsulation laminate 11 will be sucked into the material-collecting and sorting device 24 for collecting and sorting. After the solar cell fragments and the adhesive layer fragments are collected in the material-collecting and sorting device 24, they are further separated by cyclone action and a sieving method. With a single system to simultaneously achieve the effects of suctioning, sorting and collecting of recycling materials, the costs of recycling is reduced and the production value is increased.

Noteworthily, by using the system of this disclosure to dismantle the solar cell module 10 and the dismantling method thereof, it is apparent that the dismantling process is all physical, and does not include any chemical process. Further, there is absolutely no added water or thermal process. The dismantling process is completed in an anhydrous and normal temperature environment, which not only can effectively reduce the cost of the dismantling process, but also the physical properties of the recycled materials after dismantling will not change and can be completely preserved.

In summary, the system of this disclosure for physically dismantling the solar cell module 10 and the dismantling method thereof uses the CNC spindle as the fragmenting member 231 for physically fragmenting the back plate 12 and the cell encapsulation laminate 11, and the recycled materials obtained through shaving can be directly sucked into the material-collecting and sorting device 24 for collecting and sorting, so that different fragment size of the recycled materials can be separated. The overall dismantling process is purely physical and simple without including any chemical process. Further, there is no need to recycle the solar cell module 10 in high temperature energy-consuming manner as in the existing ones, thereby avoiding contamination of the recycled materials and completely retaining all the recycled materials. Hence, the cost of recycling can be effectively reduced. Therefore, the object of this disclosure can indeed be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A system for physically dismantling a solar cell module that includes a cell encapsulation laminate, and a back plate and a cover plate respectively disposed on two opposite sides of the cell encapsulation laminate, said system comprising:
    two fragmenting apparatuses each of which including
    a platform,
    a fragmenting unit disposed on said platform and movable relative to said platform in three axial directions for fragmenting one of the cell encapsulation laminate and the back plate of the solar cell module, and
    a material-collecting and sorting device connected to one of said platform and said fragmenting unit for collecting and sorting recycled materials produced by said fragmenting unit.

2. The system as claimed in claim 1, wherein:
    said platform of one of said fragmenting apparatuses is configured to support the solar cell module, and said fragmenting unit of said one of said fragmenting apparatuses is configured to contact and fragment the back plate to thereby leave a yet-to-be fragmented product composed of the cell encapsulation laminate and the cover plate; and
    said platform of the other one of said fragmenting apparatuses is configured to support the yet-to-be fragmented product, and said fragmenting unit of said other one of said fragmenting apparatuses is configured to contact and fragment the cell encapsulation laminate.

3. The system as claimed in claim 2, wherein said fragmenting units of said fragmenting apparatuses are configured to fragment the back plate and the cell encapsulation laminate by a physical fragmenting method, such as shaving, milling, scraping, cutting, or planing.

4. The system as claimed in claim 2, wherein said fragmenting unit of each of said fragmenting apparatuses includes a fragmenting member which has a CNC spindle for connecting and driving a tool for fragmenting one of the back plate and the cell encapsulation laminate.

5. The system as claimed in claim 1, wherein said material-collecting and sorting device includes an air filter having an exhaust opening, a blower connected to said air filter, a sorting unit connected to said blower, and a material-collecting container removably connected to said sorting unit.

6. The system as claimed in claim 5, wherein:
    said sorting unit includes a material inlet for entry of the recycled materials, a screen for sorting the recycled materials according to fragment size, a cyclone separator connected to said screen and capable of separating solids from gas, a material outlet, and at least one flow-guiding plate disposed in an interior of said sorting unit at a position corresponding to said material inlet;
    when the recycled materials enter said material inlet and pass through said at least one flow-guiding plate, the recycled materials are separated by said screen and a vortex effect into small fragments of the recycled materials and large fragments of the recycled materials; and
    said material-collecting container is configured to collect the small fragments, and said material outlet is configured to discharge the large fragments.

7. The system as claimed in claim 1, wherein each of said fragmenting apparatuses further includes a flattening unit that is disposed on said platform and that includes at least one fixing member for fixing the solar cell module to said platform.

8. The system as claimed in claim 7, wherein said at least one fixing member is a press plate disposed on a lateral side of said platform such that the solar cell module is disposed between said platform and said at least one fixing member.

9. The system as claimed in claim 1, wherein:
said two fragmenting apparatuses are disposed one after the other along an operation line;
said platform of an upstream one of said fragmenting apparatuses is configured to support the solar cell module, said fragmenting unit of said upstream one of said fragmenting apparatuses is configured to fragment and remove the back plate, and said material-collecting and sorting device of said upstream one of said fragmenting unit is used for collecting and sorting recycled materials produced from the back plate, leaving a yet-to-be fragmented product composed of the cell encapsulation laminate and the cover plate; and
said platform of a downstream one of said fragmenting apparatuses is configured to support the yet-to-be fragmented product that is fed from said platform of the upstream fragmenting apparatus, said fragmenting unit of said downstream one of said fragmenting apparatuses is configured to fragment and remove the cell encapsulation laminate of the yet-to-be fragmented product, and said material-collecting and sorting device of said downstream one of said fragmenting unit is used for collecting and sorting recycled materials produced from the cell encapsulation laminate, thereby leaving the cover plate in one piece.

10. The system as claimed in claim 9, wherein said fragmenting unit of each of said fragmenting apparatuses includes a fragmenting member having a CNC spindle for connecting and driving a tool for shaving, milling, scraping, cutting, or planing.

11. The system as claimed in claim 9, wherein said material-collecting and sorting device of at least one of said fragmenting apparatuses includes a cyclone separator.

* * * * *